United States Patent
Grundbacher et al.

(10) Patent No.: US 6,524,899 B1
(45) Date of Patent: Feb. 25, 2003

(54) PROCESS FOR FORMING A LARGE AREA, HIGH GATE CURRENT HEMT DIODE

(75) Inventors: Ronald W. Grundbacher, Hermosa Beach, CA (US); Richard Lai, Redondo Beach, CA (US); Mark Kintis, Manhattan Beach, CA (US); Michael E. Barsky, Sherman Oaks, CA (US); Roger S. Tsai, Torrance, CA (US)

(73) Assignee: TRW Inc., Redondo Beach, CA (US)

( * ) Notice: Subject to any disclaimer, the term of this patent is extended or adjusted under 35 U.S.C. 154(b) by 25 days.

(21) Appl. No.: 09/667,360

(22) Filed: Sep. 21, 2000

(51) Int. Cl.$^7$ ............................................. H01L 21/338
(52) U.S. Cl. ...................... 438/167; 438/170; 438/172; 438/718; 438/753
(58) Field of Search ................. 438/745, 752, 438/753, 718, 167, 168, 169, 170, 171, 172

(56) References Cited

U.S. PATENT DOCUMENTS

| | | | | |
|---|---|---|---|---|
| 4,461,071 A | * | 7/1984 | Poleshuk | 29/571 |
| 4,482,442 A | * | 11/1984 | Kohl et al. | 204/129.3 |
| 4,584,027 A | * | 4/1986 | Metz, Jr. et al. | 148/1.5 |
| 4,613,417 A | * | 9/1986 | Laskowski et al. | 204/129.85 |
| 4,679,303 A | * | 7/1987 | Chen et al. | 29/571 |
| 5,374,328 A | | 12/1994 | Remba | |
| 5,445,985 A | * | 8/1995 | Calviello et al. | 437/51 |
| 5,468,343 A | * | 11/1995 | Kitano | 156/656.1 |
| 5,639,343 A | * | 6/1997 | Dobkin | 156/627.1 |
| 6,093,657 A | * | 7/2000 | Ohkubo et al. | 438/745 |

OTHER PUBLICATIONS

Chang, E. Y., et al., *Highly Selective Etch Process for the Manufacture of GaAs Power MESFET's*, Proceedings of the State-of-the-Art Program on Compound Semiconductors (SOTAPOCS XXX) (Electrochemical Society Proceedings, vol. 99–4), State-of-the-Art Program on Compound Semiconductors XXX, Seattle, WA, USA, May 2–7, 1999, pp. 40–46, XP001033638, 1999, Pennington, NJ, USA, Electrochem. Soc., USA.

Chang, H–C., et al., *Highly Selective GaAs/AL$_{0.2}$Ga$_{0.8}$ As Wet Etch Process for the Gate Recess of Low–Voltage–Power Pseudomorphic High–Electron–Mobility Transistor*, Japanese Journal of Applied Physics, Publication Office Japanese Journal of Applied Physics, Tokyo, JP, vol. 39, No. 8, Part 1, Aug. 1, 2000, pp. 4699–4703, XP001014854.

Takatomo, Enoki, et al., *Ultra–High–Speed InAlAs/InGaAs HEMT Ics Using pn–Level–Shift Diodes*, Technical Digest of the International Electron Devices Meeting (IEDM), Washington, Dec. 10–13, 1995, New York, IEEE, US, Dec. 10, 1995, PP. 193–196, XP000624718.

(List continued on next page.)

*Primary Examiner*—Caridad Everhart
*Assistant Examiner*—Renzo N. Rocchegiani
(74) *Attorney, Agent, or Firm*—Antonelli, Terry, Stout & Kraus, LLP

(57) ABSTRACT

A method of manufacturing a HEMT IC using a citric acid etchant. In order that gates of different sizes may be formed with a single etching step, a citric acid etchant is used which includes potassium citrate, citric acid and hydrogen peroxide. The wafer is first spin coated with a photoresist which is then patterned by optical lithography. The wafer is dipped in the etchant to etch the exposed semiconductor material. Metal electrodes are evaporated onto the wafer and the remaining photoresist is removed with solvent.

11 Claims, 5 Drawing Sheets

OTHER PUBLICATIONS

Elgaid, K., et al., *Optimisation of DC and RF Performance of GaAs HEMT–Based Schottky Diodes*, Electronics Letters, IEE Stevenage, GB, vol. 35, No. 19, Sep. 16, 1999, pp. 1678–1679, XP006012683.

R. Lai, et al. "A 0.15 μm InGaAs/AlGaAs/GaAs HEMT Production Process for High Performance and High Yield V–band Power MMICs", 1995 IEEE GaAs IC Symposium Tech. Digest, p. 105.

R. Lai, et al., "A 0.1 μm InGaAs/InAl/As/InP HEMT Production Process for High Volume MMW Applications", 1999 IEEE GaAs IC Symposium Tech. Digest, p. 249.

Schumaker, et al., "Highly Selective Citric Buffer Etch–Stop Process for the Manufacture of Very Uniform GaAs/AlGaAs FETs", 1993 IEEE GaAs IC Symposium Tech. Digest, pp. 325–238.

* cited by examiner

PROCESS FOR FORMING A LARGE AREA, HIGH GATE CURRENT HEMT DIODE

BACKGROUND

1. Field of the Invention

This invention relates generally to a process for making a high gate current HEMT diode and, more particularly, to a process for forming a large area, high gate current HEMT diode using a citric acid etch.

2. Discussion of the Background

Various methods have been proposed to manufacture high electron mobility transistor (HEMT) devices. These devices are typically formed as integrated circuits having both diodes and transistors. While such methods have been used to produce HEMT devices, new uses for the devices which have more stringent requirements, as well as a continual reduction in design size require additional processes in order to achieve the desired arrangements.

Currently, there is a need to produce a HEMT diode that has a smaller total area, but which has a large diode periphery. The periphery is determinative of the current handling capability of the diode. Typically, the HEMT diodes have had the same size gates as the HEMT transistors in the same integrated circuit. For high frequency requirements, the gate length of the transistor has to be small (i.e. submicron dimension). However, such a small gate cross-sectional area is inappropriate for high current diode applications. The large current levels can often cause electromigration of the gate metal when the gates are of this submicron dimension. Previously, in order to handle this situation, the diodes were formed with several fingers to avoid current crowding and electromigration. However, in order to have large periphery diodes, many fingers have to be arranged in parallel which results in a diode occupying a large surface area of the substrate.

Furthermore, it has not been possible to fabricate large area gate HEMT diodes along with small gate HEMT transistors because the sub-micron gate etchant cannot uniformly etch the larger gates. Accordingly, there is a need for a process of making HEMT IC devices to produce diodes having a large periphery but a small area that can handle high gate currents without crowding or electromigration problems.

In general, a previous process for forming a large area diode is seen in FIG. 1A–1F. In FIG. 1A, a starting material is a semiconductor wafer of a heterostructure field effect transistor. In FIG. 1B, the wafer is spin coated with a photoresist so that a thin layer (1,000 nm) of photoresist is left on the wafer. Many different photoresists may be used, such as photoresist 1813 manufactured by Shipley Corporation. The photoresist is patterned and the pattern is developed using an aqueous chemical developer as shown in FIG. 1C. The wafer is dipped into a solution which etches the exposed semiconductor material, as shown in FIG. 1D. A metal is evaporated onto the wafer as shown in FIG. 1E. The metal may be a laminate of titanium/gold, molybdenum/gold, platinum/titanium/gold or other metals, as is known. Typical titanium and platinum thicknesses are 20–40 nm, while typical gold thickness is 500–700 nm. The resultant wafer is then put into a solvent such as acetone in order to remove the remaining photoresist and metal which is on the photoresist. The only remaining metal is that which is in the etched area of the wafer. The metal in the etched area forms the gate for a large area diode.

When using this process to form HEMT IC devices, there has been a problem that the etchant is not uniform and that for large area diodes, the etchant often produces a trench along the edge of such a diode or does not etch uniformly over the large area. That is, the etchant removes too much material at the base of a vertical section of the diode.

The prior art has also taught the use of a different type of etchant using citric acid, as described in the article "Highly Selective Citric Buffer Etch-Stop Process for the Manufacture of Very Uniform GaAs/AlGaAs FETs" by Schmukler, et al, 1993 IEEE GaAs IC Symposium Tech. Digest, page 325–328. However, this type of etchant has not been utilized in regard to the formation of large area HEMT diodes.

SUMMARY OF THE INVENTION

Accordingly, one object of the invention is to provide a simple and inexpensive process for forming an HEMT IC device.

Another object of this invention is to provide a method for forming a large area, high gate current handling diode on a HEMT heterostructure.

Another object of this invention is to provide a method for forming an HEMT IC device with different size gates for the diodes and transistors using the same etchant.

A still further object of this invention is to provide a method for forming a large area diode having a large diode periphery and an HEMT IC device utilizing a citric acid etchant.

Briefly, these and other objects of this invention are achieved by providing a different type of etchant in the process for forming an HEMT device where the etchant includes potassium citrate, citric acid and hydrogen peroxide.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
FIGS. 1A–1F are diagrams showing a prior art method of making a HEMT device.
Figure 1B:
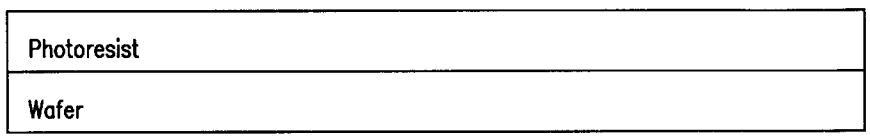
Figure 1C:
Figure 1D:
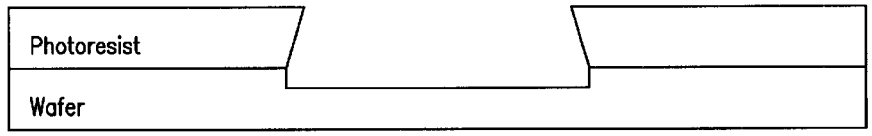
Figure 1E:
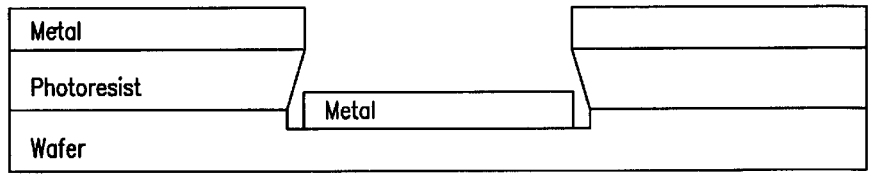
Figure 1F:
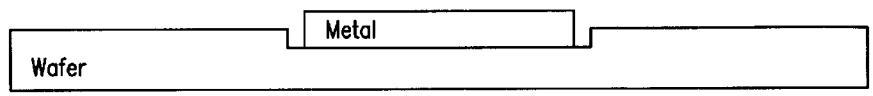
Figure 2:
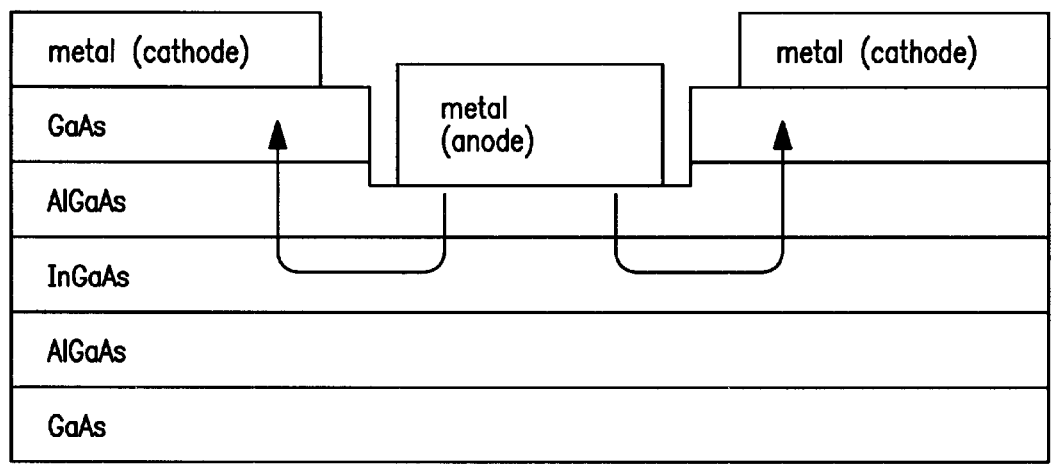
FIG. 2 is a cross-sectional view of large area diode of the GaAs/AlGaAs type made according to the present invention.
Figure 3:
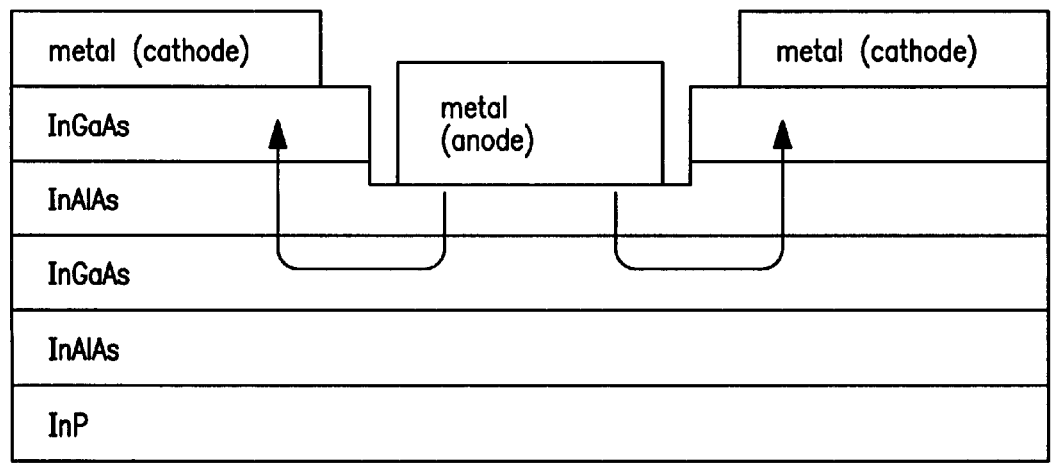
FIG. 3 is a cross-sectional view of a large area diode of the InGaAs/InAlAs/InP type made according to the present invention.

Referring now to the drawings, wherein like reference numerals designate identical or corresponding parts throughout the several views, and more particularly to FIG. 2 thereof, which shows a cross-sectional view of a large area diode GaAs/AlGaAs HFET wafer. This figure shows the detailed layers of the wafer along with the metal anodes and cathodes. When current flows from the anode to the cathode as indicated by arrows, it descends to the central layer of InGaAs, along this layer and then back up to the metal cathode. In a different material diode of InGaAs/InAlAs/InP devices shown in FIG. 3, the same movement of current occurs. Since the thickness of this layer is fixed due to other parameters, the cross-sectional area and hence the amount of current that may be carried by the device depends on the size of the periphery of the anode at the active area. That is, the periphery is the limiting factor for the passage of the current through the cathode.

Figure 4:
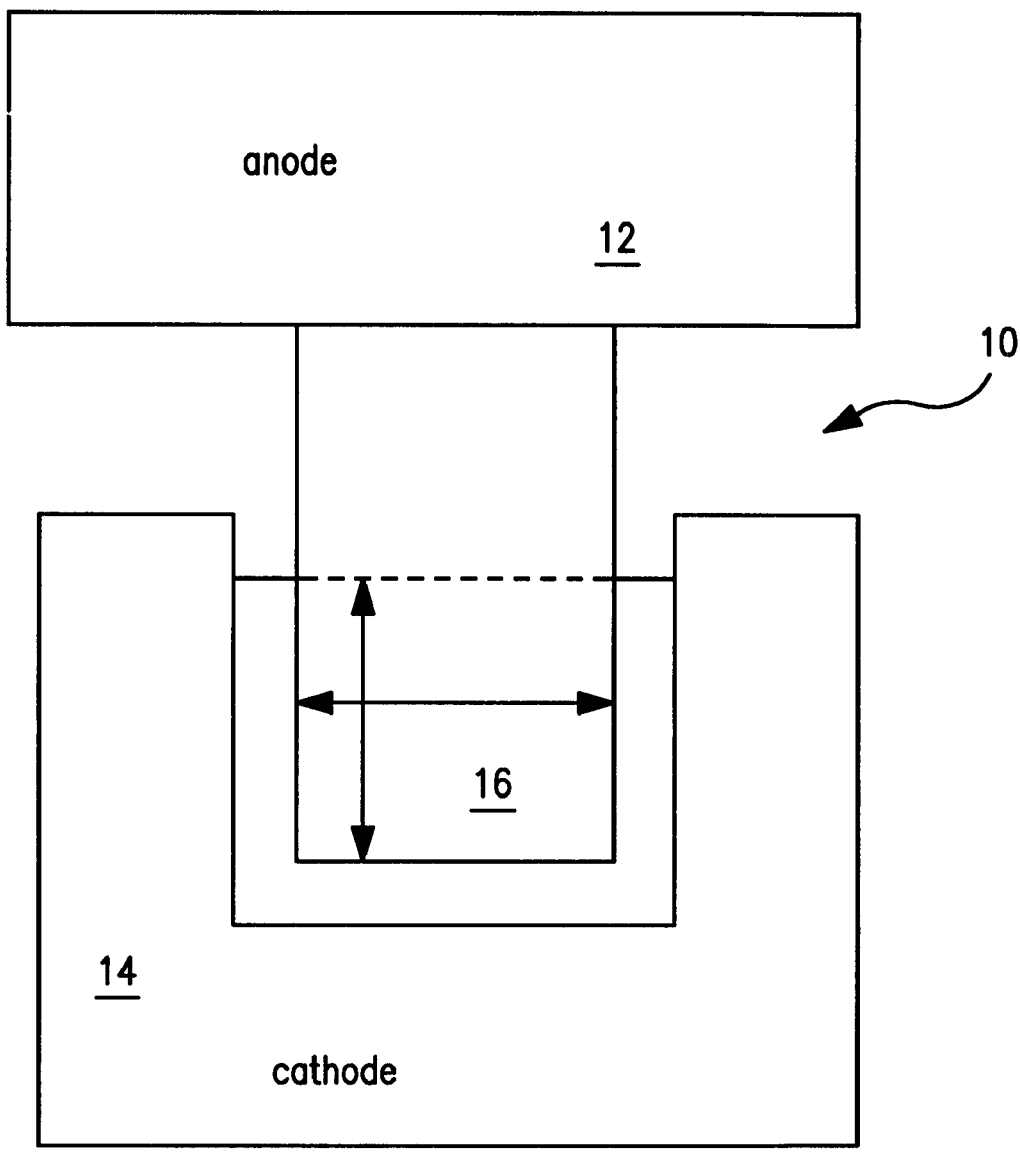
FIG. 4 is a top view of a large area diode made according to the present invention.

As shown in FIG. 4, the large area diode 10 includes an anode 12 and cathode 14. The cathode is formed as a U on top of the etched wafer, while the anode has an extension which is extended into the open side of the U. The active region 16 of the anode is that part of it which extends inside the U and over the etched part of the wafer. Thus, the active barrier is a square having, for example, a size of 6 microns by 6 microns. Because the current flows as indicated above, the determining factor for the flow of the current is the periphery of this square active region. Since the current can flow to the cathode only on three sides because the cathode is not present on the fourth side, the periphery, as far as the current flow is concerned, is the sum of the dimensions of these three sides or 3×6 microns=18 microns.

Prior art finger diode devices with small cross-sectional area have had problems with electromigration. This is a phenomenon in which the metal atoms migrate or move. This effect is caused by current flowing through the metal electrodes. Such electromigration can create voids in the metal structure which may then prevent the current from flowing. The problem of electromigration increases as the metal structure becomes smaller or as the current levels increase. Since prior art finger diodes have a small cross-sectional area compared to the large area diode, it is more likely that the electromigration of metal atoms will occur in the finger diode for a given current level. By having a larger area diode the problem of electromigration decreases compared to that for a finger diode. The result is that the large area diode allows a higher current and has better reliability than the prior art finger diodes.

Figure 5A:
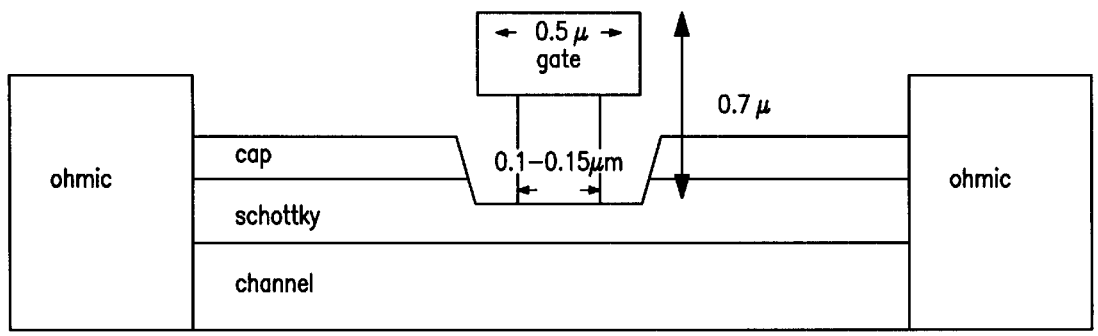
FIG. 5A shows a cross-sectional view of a prior art finger diode device.

FIG. 5A shows a cross-sectional view of a prior art finger diode device. The width of the gate at the top is roughly 0.5 micron, while the width at the bottom is 0.1–0.15 micron. The height from the bottom to the top of the gate is roughly 0.7 micron.

Figure 5B:
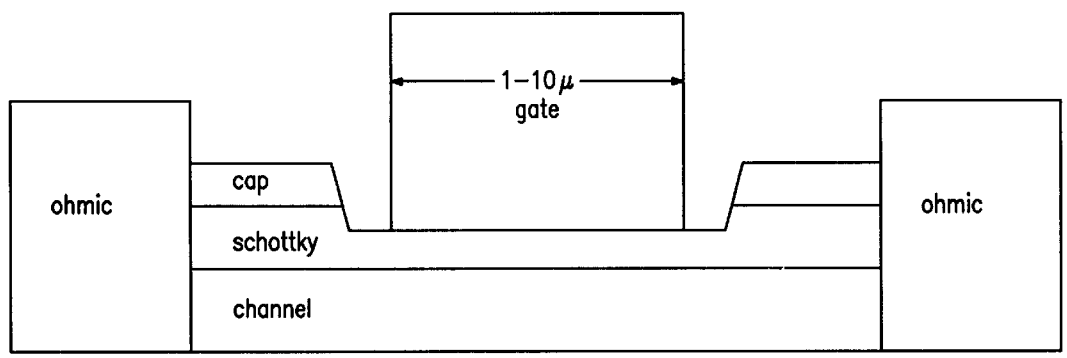
FIG. 5B shows a cross-sectional view of a large area diode formed according to the present invention.
Figure 6:
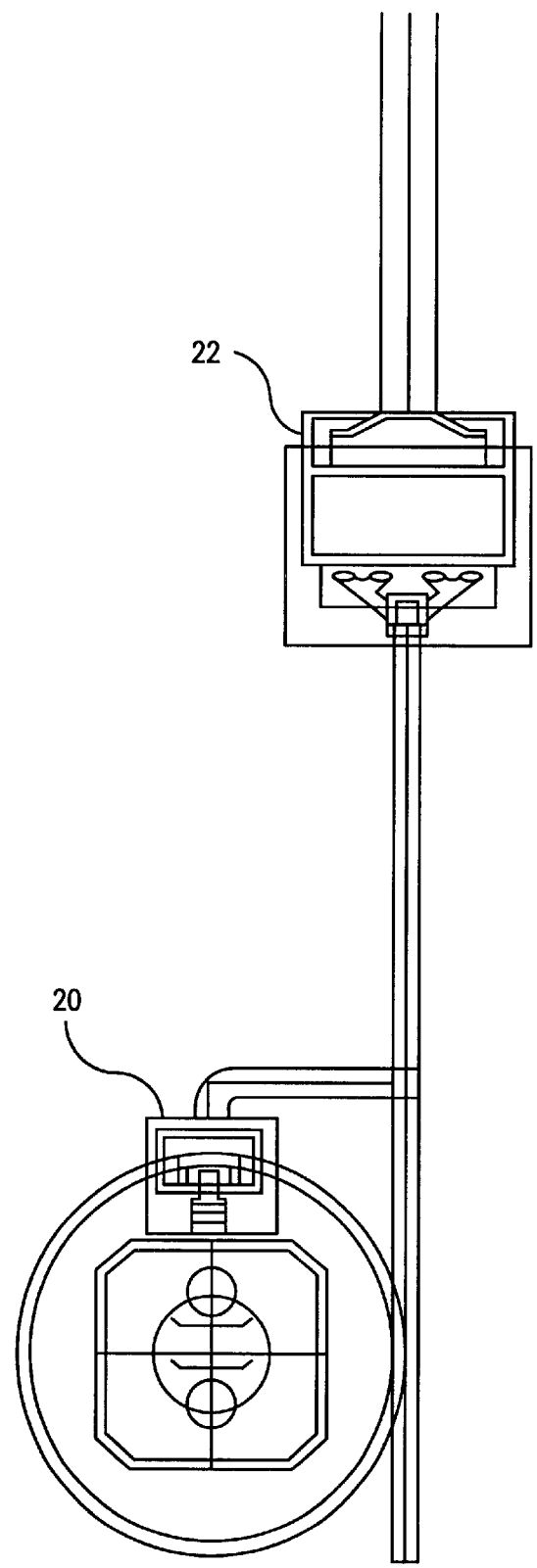
FIG. 6 is a top view of a circuit having both a large area diode and a finger diode.

FIG. 5B shows a large area diode in a similar arrangement. However, the width of the gate in this type of device is typically 1–10 microns. The term "large area diode" refers to the size of the active region as described above. Thus, by providing a large active region rather than smaller finger regions, the diode actually takes up less surface area than that of the finger diode. That is, in order to have an adequate peripheral area in the finger diodes, the fingers must extend over a large area and thus require more space. FIG. 6 shows a top view of the circuit having both a large area diode 20 and a finger diode 22. The large area diode occupies an overall area about a factor of 3 smaller than the finger diode.

Thus, by having the configuration involving a large area diode, the problems of electromigration are avoided, a smaller overall area is achieved and the possibility of higher current handling and better reliability are possible.

As indicated earlier, it is difficult to form such a device using prior art processes because of the difference in size between the cross-sectional area of the gate of the diodes as compared to the cross-sectional area of the gate of the transistors. It has been discovered that by using a citric acid type etchant that it is possible to obtain uniform etching despite the difference in size of the gate electrodes. In particular, the problem with having trenching is avoided and a very uniform diode gate is formed. These advantages have been previously unrealized.

The particular etchant used is a potassium citrate/citric acid/hydrogen peroxide mixture. It is used to remove the top conducting layer of semiconductor material of about 10–50 nm thickness.

If the semiconductor material is GaAs/AlGaAs, then the etching solution is 30.6 g potassium citrate dissolved in 304 ml of water, 104 ml of 1M citric acid and 84 ml hydrogen peroxide or similar comparable ratios. The semiconductor material is etched down to the AlGaAs region as shown in FIG. 2.

If the semiconductor material is InGaAs/InAlAs/InP, then the etching solution would be 15 g potassium citrate dissolved in 100 ml water, 33 ml 1M citric acid, and 27 ml hydrogen peroxide or comparable ratios. In this case, the material is etched down to the InAlAs region as shown in FIG. 4.

This etchant is then used in the process for forming a large area diode including starting with a wafer, spin coating the wafer with photoresist, patterning the photoresist by optical lithography, etching the exposed semiconductor material with a citric acid etchant, evaporating metal electrodes onto the wafer and removing the remaining photoresist and metal by dissolving in a solvent. Two such methods are disclosed in papers by R. Lai, et al, the first being entitled "A 0.15 $\mu$m InGaAs/AlGaAs/GaAs HEMT Production Process for High Performance and High Yield V-band Power MMICs", 1995 IEEE GaAs IC Symposium Tech. Digest, page 105, and the second being entitled "0.1 $\mu$m InGaAs/InAlAs/InP HEMT Production Process for High Volume MMW Applications", 1999 IEEE GaAs IC Symposium Tech. Digest, page 249.

The result of this process is a large area diode which has a gate current versus gate voltage relationship that is free of voltage spikes or current suckouts. Further, the diode gate electromigration problems are eliminated while the large cross-section gate for the diode can be formed on the same mask as the sub micron gate devices. As a result, the device can be formed more easily and at less expense. The favorable results which are obtained are considerably better than those obtained with other etchants and avoid the problems of trenching, electromigration and other problems. Accordingly, the use of this citric acid etchant produces results which are unexpected and unrealized by prior art etchants in the same process.

Numerous additional modifications and variations of the present invention are possible in light of the above teachings. It is, therefore, to be understood that within the scope of the appended claims, the invention may be practiced otherwise than as specifically described herein.

What is claimed is:

1. A method of forming a semiconductor device having at least one large area diode, comprising;

placing photoresist on a semiconductor wafer;

forming a pattern in the photoresist;

etching the wafer with an etchant of potassium citrate, citric acid and hydrogen peroxide; and depositing metal for the gate of said at least one large area diode onto the wafer.

2. The method according to claim 1, wherein the wafer is GaAs/AlGaAs.

3. The method according to claim 2, comprising etching the wafer to the AlGaAs layer.

4. The method according to claim 2, wherein the etchant is a solution having a ratio substantially comparable to that of 30.6 g potassium citrate dissolved in 304 ml of water, 104 ml of 1M citric acid and 84 ml hydrogen peroxide.

5. The method according to claim 1, wherein the wafer is InGaAs/InAlAs/InP.

6. The method according to claim 5, comprising etching the wafer to the InAlAs layer.

7. The method according to claim 5, wherein the etchant is a solution having a ratio substantially comparable to that of 15 g potassium citrate dissolved in 100 ml of water, 33 ml of 1M citric acid and 27 ml hydrogen peroxide.

8. The method according to claim 1, wherein the same etchant is used to form a plurality of diodes and a plurality of transistors, said plurality of diodes having different size gates than said plurality of transistors.

9. The method according to claim 1, wherein the device includes a circuit having both a large area diode and a finger diode.

10. The method according to claim 9, wherein the finger diode occupies an overall area which Is about three times larger than the overall area occupied by the large area diode.

11. A method of forming a semiconductor device having at least one large area diode, comprising:
   placing photoresist on a semiconductor wafer;
   forming a pattern in the photoresist;
   etching the wafer with an etchant of potassium citrate, citric acid and hydrogen peroxide;
   evaporating metal for the gate of said at least one large area diode onto the wafer; and
   placing the wafer in a solvent.

* * * * *